(12) United States Patent
Nabeth et al.

(10) Patent No.: US 10,340,165 B2
(45) Date of Patent: Jul. 2, 2019

(54) SYSTEMS AND METHODS FOR AUTOMATED MULTI-ZONE DETECTION AND MODELING

(71) Applicant: KLA-Tencor Corporation, Milpitas, CA (US)

(72) Inventors: Jeremy Nabeth, Austin, TX (US); Onur N. Demirer, Austin, TX (US); Ramkumar Karur-Shanmugam, Austin, TX (US); Choon (George) Hoong Hoo, Singapore (SG); Christian Sparka, Dresden (DE); Hoyoung Heo, Gyeonggi-do (KR); Stuart Sherwin, San Jose, CA (US); Fatima Anis, Milpitas, CA (US); Mark D. Smith, San Jose, CA (US); William Pierson, Austin, TX (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/451,038

(22) Filed: Mar. 6, 2017

(65) Prior Publication Data

US 2017/0287754 A1 Oct. 5, 2017

Related U.S. Application Data

(60) Provisional application No. 62/314,854, filed on Mar. 29, 2016.

(51) Int. Cl.
*G01C 1/06* (2006.01)
*H01L 21/67* (2006.01)
(Continued)

(52) U.S. Cl.
CPC ...... *H01L 21/67259* (2013.01); *G01B 11/002* (2013.01); *G01B 11/272* (2013.01);
(Continued)

(58) Field of Classification Search
CPC ............. G01B 11/272; G01B 2210/56; G06F 17/5009; H01L 21/67259; H01L 23/544
USPC .......................................... 356/139, 399–401
See application file for complete search history.

(56) References Cited

U.S. PATENT DOCUMENTS 5,966,215 A * 10/1999 Markoya ............. G03F 7/70358
250/548
6,628,406 B1 * 9/2003 Kreuzer ............. G03F 7/70358
356/508
(Continued)

OTHER PUBLICATIONS

International Search Report for International Application No. PCT/US2017/024490 dated Aug. 18, 2017, 3 pages.

*Primary Examiner* — Isiaka O Akanbi
(74) *Attorney, Agent, or Firm* — Suiter Swantz pc llo

(57) ABSTRACT

A semiconductor tool includes an illumination source to generate an illumination beam, one or more illumination optical elements to direct a portion of the illumination beam to a sample, a detector, one or more collection optical elements to direct radiation emanating from the sample to the detector, and a controller communicatively coupled to the detector. The controller is configured to measure alignment at a plurality of locations across the sample to generate alignment data, select an analysis area for alignment zone determination, divide the analysis area into two or more alignment zones having different alignment signatures; model the alignment data of at least a first alignment zone of the two or more alignment zones using a first alignment model, and model the alignment data of at least a second alignment zone of the two or more alignment zones using a second alignment model different than the first alignment model.

34 Claims, 9 Drawing Sheets

(51) Int. Cl.
   *G01B 11/27*   (2006.01)
   *G06F 17/50*   (2006.01)
   *G01B 11/00*   (2006.01)
   *G03F 7/20*    (2006.01)
   *G03F 9/00*    (2006.01)

(52) U.S. Cl.
   CPC ........ *G03F 7/70633* (2013.01); *G03F 9/7046* (2013.01); *G06F 17/5009* (2013.01); *G01B 2210/56* (2013.01)

(56) References Cited

U.S. PATENT DOCUMENTS

| | | | |
|---|---|---|---|
| 9,291,916 B2 | 3/2016 | Van Der Sanden et al. | |
| 2006/0061743 A1* | 3/2006 | Den Boef | G03F 9/7088 355/53 |
| 2006/0291714 A1* | 12/2006 | Wu | G01N 21/95607 382/149 |
| 2013/0258306 A1* | 10/2013 | Huang | G03F 9/7049 355/72 |
| 2014/0195992 A1* | 7/2014 | Ramachandran | G01N 21/9501 716/51 |
| 2015/0177159 A1 | 6/2015 | Brown et al. | |
| 2015/0199463 A1* | 7/2015 | Iloreta | H01L 22/12 716/100 |
| 2015/0261097 A1 | 9/2015 | Mathijssen et al. | |
| 2015/0316468 A1* | 11/2015 | Shafir | G01N 21/21 356/366 |
| 2015/0324965 A1* | 11/2015 | Kulkarni | G01N 21/9501 382/144 |
| 2016/0314578 A1* | 10/2016 | Banerjee | G06T 7/001 |

\* cited by examiner

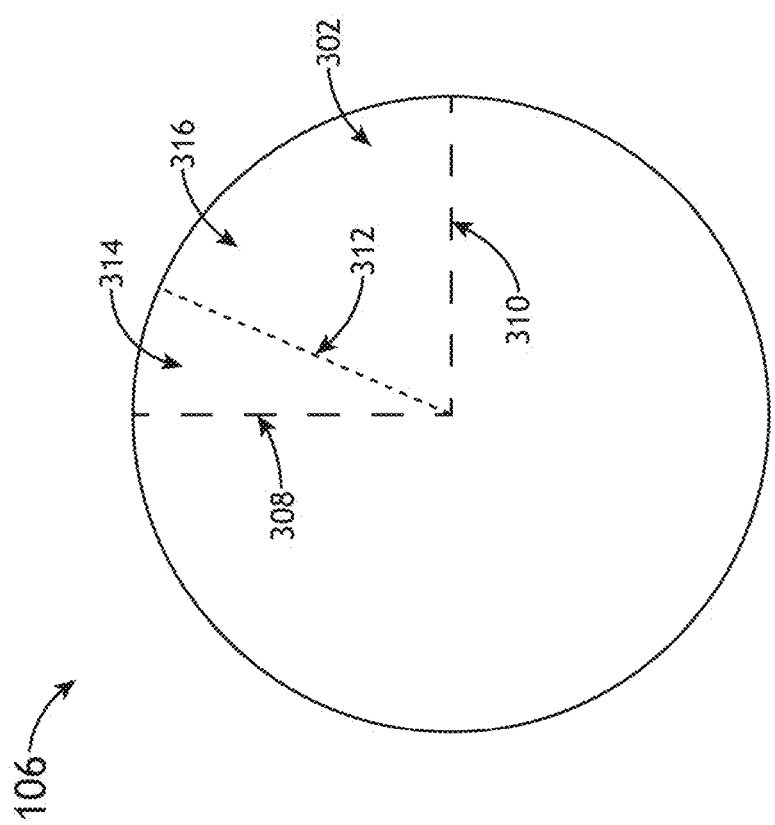

SYSTEMS AND METHODS FOR AUTOMATED MULTI-ZONE DETECTION AND MODELING

CROSS-REFERENCE TO RELATED APPLICATION

The present application claims the benefit under 35 U.S.C. § 119(e) of U.S. Provisional Application Ser. No. 62/314,854, filed Mar. 29, 2016, entitled AUTOMATED MULTI ZONE DETECTION AND MODELING, naming Jeremy Simon Nabeth, Onur Nihat Demirer, Ramkumar Karur-Shanmugam, George Hoo, Christian Sparka, Hoyoung Heo, Stuart Sherwin, Fatima Anis, Mark D. Smith, and William Fred Pierson as inventors, which is incorporated herein by reference in the entirety.

TECHNICAL FIELD

The present disclosure generally relates to multi-zone metrology and, more particularly, to automated multi-zone metrology.

BACKGROUND

Semiconductor wafers must be accurately positioned within fabrication tools at various steps of a fabrication process to properly generate printed features. Accordingly, metrology tools may be utilized throughout a fabrication process to monitor alignment of the wafer within a fabrication tool and/or overlay of printed layers on the wafer. For example, a metrology tool may measure the alignment of a wafer in a lithography tool prior to an exposure step to ensure that a pattern to be exposed is properly aligned with existing features on the sample. By way of another example, a metrology tool may measure the overlay of two or more printed layers on the wafer to characterize the precision of the fabrication process.

Metrology tools may typically measure alignment at multiple locations across a wafer and characterize alignment data using a mathematical model. Alignment data may include, but is not limited to, sample alignment data associated with the alignment of the sample in a fabrication tool or overlay data associated with the alignment of two or more printed layers of the wafer. It may be the case that different regions, or zones, of a wafer may exhibit different alignment signatures such that modeling each zone with a separate model may provide increased accuracy compared to a single alignment model applied to the whole wafer. However, determining multiple zones on a wafer having different alignment signatures may require input from a user and may negatively impact throughput. Therefore, it would be desirable to provide a system and method for curing defects such as those identified above.

SUMMARY

A semiconductor tool is disclosed in accordance with one or more illustrative embodiments of the present disclosure. In one illustrative embodiment, the semiconductor tool includes an illumination source to generate an illumination beam. In another illustrative embodiment, the semiconductor tool includes one or more illumination optical elements to direct a portion of the illumination beam to a sample. In another illustrative embodiment, the semiconductor tool includes a detector. In another illustrative embodiment, the semiconductor tool includes one or more collection optical elements to direct radiation emanating from the sample to the detector. In another illustrative embodiment, the semiconductor tool includes a controller communicatively coupled to the detector. In another illustrative embodiment, the controller is configured to measure alignment at a plurality of locations across the sample to generate alignment data based on the collection of radiation emanating from the sample by the detector in response to illumination from the illumination beam. In another illustrative embodiment, the controller is configured to select an analysis area for alignment zone determination, the analysis area representative of at least a portion of the sample. In another illustrative embodiment, the controller is configured to divide the analysis area into two or more alignment zones having different alignment signatures. In another illustrative embodiment, the controller is configured to model the alignment data of at least a first alignment zone of the two or more alignment zones using a first alignment model. In another illustrative embodiment, the controller is configured to model the alignment data of at least a second alignment zone of the two or more alignment zones using a second alignment model different than the first alignment model.

A semiconductor tool is disclosed in accordance with one or more illustrative embodiments of the present disclosure. In one illustrative embodiment, the semiconductor tool includes an illumination source configured to generate an illumination beam. In another illustrative embodiment, the semiconductor tool includes one or more illumination optical elements configured to direct a portion of the illumination beam to a sample. In another illustrative embodiment, the semiconductor tool includes a detector. In another illustrative embodiment, the semiconductor tool includes one or more collection optical elements configured to direct radiation emanating from the sample to the detector. In another illustrative embodiment, the semiconductor tool includes a controller communicatively coupled to the detector. In another illustrative embodiment, the controller is configured to measure alignment at a plurality of locations across the sample to generate alignment data based on the collection of radiation emanating from the sample by the detector in response to illumination from the illumination beam. In another illustrative embodiment, the controller is configured to select an analysis area for alignment zone determination, the analysis area representative of at least a portion of the sample. In another illustrative embodiment, the controller is configured to define a sweep parameter such that each value of the sweep parameter bounded by the analysis area divides the analysis area into a first region and a second region. In another illustrative embodiment, the controller is configured to select a value of the sweep parameter as a zone boundary to minimize, within a specified tolerance, a difference between an alignment signal metric applied to the first region and the alignment signal metric applied to the second region, wherein the zone boundary divides the analysis area into a first alignment zone and a second alignment zone. In another illustrative embodiment, the controller is configured to model the alignment data of the first alignment zone using a first alignment model. In another illustrative embodiment, the controller is configured to model the alignment data of the second alignment zone using a second alignment model different than the first alignment model.

A method is disclosed in accordance with one or more illustrative embodiments of the present disclosure. In one illustrative embodiment, the method includes measuring, with a semiconductor tool, alignment at a plurality of locations across a sample to generate alignment data based on radiation emanating from the sample collected by a detector of the semiconductor tool in response to illumination from an illumination beam. In one illustrative embodiment, the method includes selecting an analysis area for alignment zone determination, the analysis area representative of at least a portion of the sample. In one illustrative embodiment, the method includes dividing the analysis area into two or more alignment zones having different alignment signatures. In one illustrative embodiment, the method includes modeling the alignment data of at least a first alignment zone of the two or more alignment zones using a first alignment model. In one illustrative embodiment, the method includes modeling the alignment data of at least a second alignment zone of the two or more alignment zones using a second alignment model different than the first alignment model.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 3B is a simplified view of a circular sample illustrating an analysis area selected to be a region of the sample defined by a first radial segment at a first polar angle and a second radial segment at a second polar angle, in accordance with one or more embodiments of the present disclosure.

DETAILED DESCRIPTION

Figure 1A:
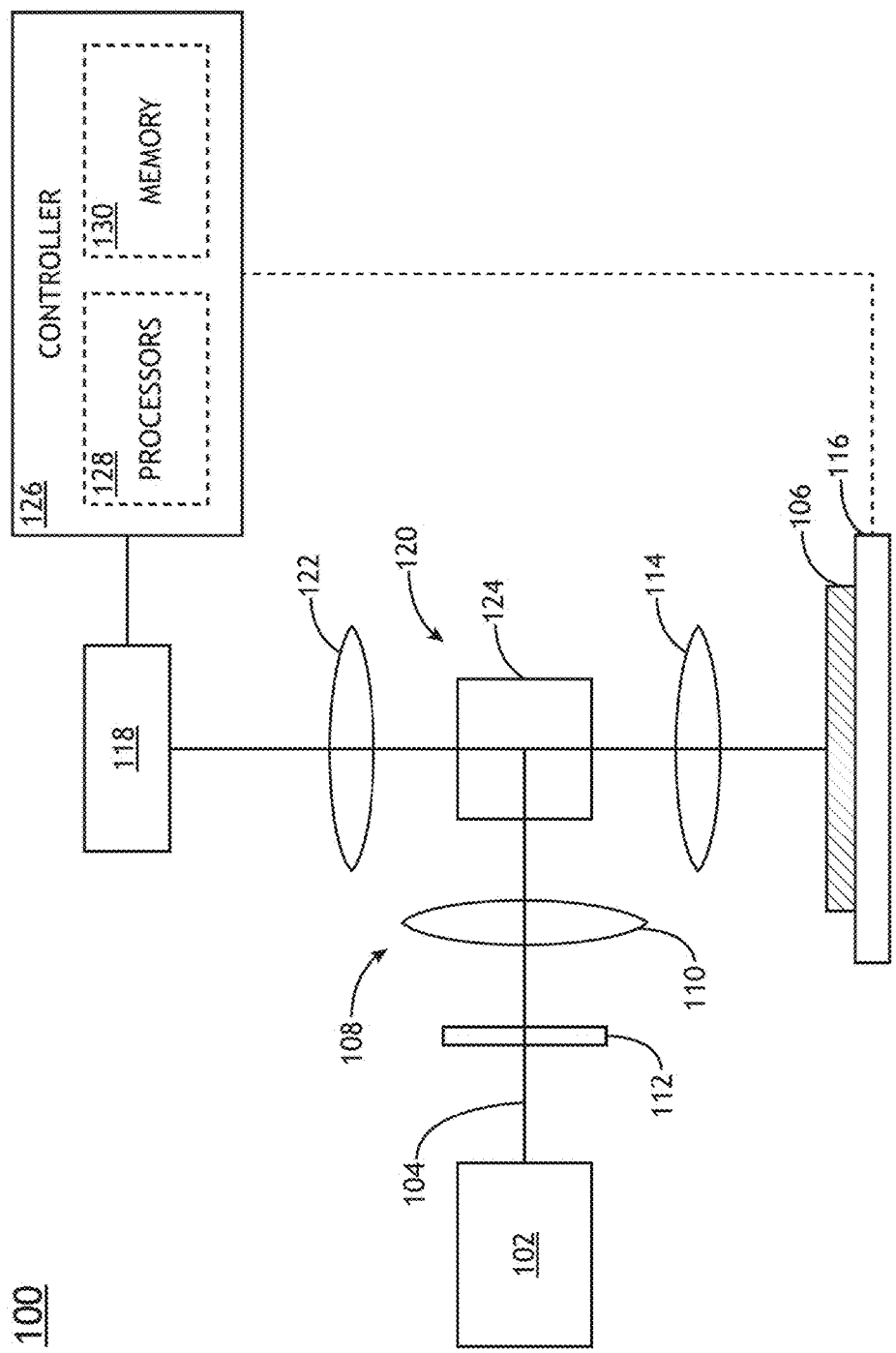
FIG. 1A is a conceptual view illustrating a metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for automatic detection of zones on a sample (e.g., a wafer) having different alignment signatures (e.g., mean alignment values, or the like). For example, a metrology tool may measure alignment data at multiple locations across the sample. Alignment data may include, but is not limited to, sample alignment data associated with the alignment of the sample in a fabrication tool or a production tool, or overlay data associated with the alignment of two or more printed layers of the sample. Further, different zones of the sample may exhibit different alignment signatures. Embodiments of the present disclosure are directed to automatically determining two or more zones of the sample having different alignment signatures. Additional embodiments of the present disclosure are directed to separately modeling alignment within the two or more zones. In this regard, the alignment residual across the entire sample may be reduced compared to a single alignment model applied across the entire sample.

As used throughout the present disclosure, the term "sample" generally refers to a substrate formed of a semiconductor or non-semiconductor material (e.g. a wafer, or the like). For example, a semiconductor or non-semiconductor material may include, but is not limited to, monocrystalline silicon, gallium arsenide, and indium phosphide. For the purposes of the present disclosure, the term sample and wafer should be interpreted as interchangeable.

A semiconductor device may be formed as multiple layers of printed elements. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated.

Printed features on a sample associated with a process layer may be fabricated through a series of additive or subtractive process steps such as, but not limited to, one or more material deposition steps, one or more lithography steps, one or more etching steps, or one or more lift-off steps. For example, a lithography-etch (LE) process for printing features may include, but is not limited to, depositing a layer of a photosensitive material onto a sample (e.g. a resist layer), exposing the sample with an image of a pattern mask to modify the resistivity of the photosensitive material to an etchant, and etching away either the exposed or unexposed portions of the photosensitive layer to leave behind printed features corresponding to the image of the pattern mask. Further, the photosensitive material may serve as a hard mask such that an etching step may include etching past the photosensitive material into one or more layers of the sample below the photosensitive material. The photosensitive material may optionally be removed by subsequent process steps.

Each process layer must be fabricated within specific tolerances to properly construct the final device. It is typically desirable that a given process layer be accurately aligned with respect to existing features on the sample. Accordingly, metrology tools may be utilized to monitor alignment at various stages of a fabrication process.

Additional embodiments of the present disclosure are directed to measuring alignment of a sample within a production tool (e.g. a lithography tool, or the like). In this regard, a metrology tool may generate alignment data at one or more locations on the sample. Alignment data may include, but is not limited to, first or high-order translation, rotation, or magnification of the sample within the production tool. For example, a metrology tool may generate alignment data associated with one or more alignment marks distributed across the sample. Alignment marks may indicate unidirectional alignment information (e.g. X-only or Y-only alignment information in Cartesian coordinates), or bidirectional alignment information (e.g. both X and Y information). Further, a metrology tool may, but is not required to, determine relative positions of alignment marks with respect to a nominal position or patterns on a reticle for alignment determination. Further embodiments of the present disclosure are directed to utilizing sample alignment data in a feedback and/or a feed-forward manner. For example, sample alignment data may be utilized on the fly to align or orient a sample in the production tool within a specified tolerance.

Additional embodiments of the present disclosure are directed to measuring overlay of two or more printed layers on a sample. In this regard, the accuracy of one or more production processes may be analyzed. For example, a metrology tool may generate overlay data associated with one or more overlay targets. Overlay targets may be any type of overlay targets known in the art such as, but not limited to advanced imaging metrology (AIM) targets, box in box targets, or scatterometry targets. Further embodiments of the present disclosure are directed to utilizing overlay data in a feedback and/or a feed-forward matter. For example, overlay data may be fed back to the production tool to compensate for overlay errors on future production runs. By way of another example, overlay data may be provided to additional production tools to compensate for any measured overlay inaccuracy of a sample in future fabrication steps involving that sample.

FIG. 1A is a conceptual view illustrating a metrology system 100, in accordance with one or more embodiments of the present disclosure. The metrology system 100 may measure alignment using any method known in the art. In one embodiment, the metrology system 100 includes an image-based metrology tool to measure alignment data based on the generation of one or more images of a sample. In another embodiment, the metrology system 100 includes a scatterometry-based metrology tool to measure metrology data based on the scattering (reflection, diffraction, diffuse scattering, or the like) of light from the sample.

In one embodiment, the metrology system 100 includes a metrology illumination source 102 to generate a metrology illumination beam 104. The metrology illumination beam 104 may include one or more selected wavelengths of light including, but not limited to, ultraviolet (UV) radiation, visible radiation, or infrared (IR) radiation.

In another embodiment, the metrology illumination source 102 directs the metrology illumination beam 104 to a sample 106 via an illumination pathway 108. The illumination pathway 108 may include one or more lenses 110 or additional optical components 112 suitable for modifying and/or conditioning the metrology illumination beam 104. For example, the one or more optical components 112 may include, but are not limited to, one or more polarizers, one or more filters, one or more beam splitters, one or more diffusers, one or more homogenizers, one or more apodizers, or one or more beam shapers. In another embodiment, the metrology system 100 includes an objective lens 114 to focus the metrology illumination beam 104 onto the sample 106.

In another embodiment, the sample 106 is disposed on a sample stage 116. The sample stage 116 may include any device suitable for positioning the sample 106 within the metrology system 100. For example, the sample stage 116 may include any combination of linear translation stages, rotational stages, tip/tilt stages or the like.

In another embodiment, the metrology system 100 includes a detector 118 configured to capture radiation emanating from the sample 106 through a collection pathway 120. For example, a detector 118 may receive an image of the sample 106 provided by elements in the collection pathway 120 (e.g., the objective lens 114, more lenses 122, or the like). By way of another example, a detector 118 may receive radiation reflected or scattered (e.g., via specular reflection, diffuse reflection, and the like) from the sample 106. By way of another example, a detector 118 may receive radiation generated by the sample 106 (e.g., luminescence associated with absorption of the metrology illumination beam 104, or the like). By way of another example, a detector 118 may receive one or more diffracted orders of radiation from the sample 106 (e.g., 0-order diffraction, ±1 order diffraction, ±2 order diffraction, and the like).

The detector 118 may include any type of optical detector known in the art suitable for measuring illumination received from the sample 106. For example, a detector 118 may include, but is not limited to, a CCD detector, a TDI detector, a photomultiplier tube (PMT), an avalanche photodiode (APD), or the like. In another embodiment, a detector 118 may include a spectroscopic detector suitable for identifying wavelengths of radiation emanating from the sample 106.

The collection pathway 120 may further include any number of optical elements to direct and/or modify illumination collected by the objective lens 114 including, but not limited to, one or more lenses 122, one or more filters, one or more polarizers, or one or more beam blocks.

In one embodiment, as illustrated in FIG. 1A, the metrology system 100 includes a beamsplitter 124 oriented such that the objective lens 114 may simultaneously direct the metrology illumination beam 104 to the sample 106 and collect radiation emanating from the sample 106. In this regard, the metrology system 100 may be configured in an epi-mode.

In another embodiment, the metrology system 100 includes a controller 126. In another embodiment, the controller 126 includes one or more processors 128 configured to execute program instructions maintained on a memory medium 130. In this regard, the one or more processors 128 of controller 126 may execute any of the various process steps described throughout the present disclosure. Further, the controller 126 may be configured to receive data including, but not limited to, metrology data (e.g. alignment measurement results, images of the target, pupil images, and the like) or metrology metrics (e.g. precision, tool-induced shift, sensitivity, diffraction efficiency, and the like).

The one or more processors 128 of a controller 126 may include any processing element known in the art. In this sense, the one or more processors 128 may include any microprocessor-type device configured to execute algorithms and/or instructions. In one embodiment, the one or more processors 128 may consist of a desktop computer, mainframe computer system, workstation, image computer, parallel processor, or any other computer system (e.g., networked computer) configured to execute a program configured to operate the metrology system 100, as described throughout the present disclosure. It is further recognized that the term "processor" may be broadly defined to encompass any device having one or more processing elements, which execute program instructions from a non-transitory memory medium 130. Further, the steps described throughout the present disclosure may be carried out by a single controller 126 or, alternatively, multiple controllers. Additionally, the controller 126 may include one or more controllers housed in a common housing or within multiple housings. In this way, any controller or combination of controllers may be separately packaged as a module suitable for integration into metrology system 100. Further, the controller 126 may analyze data received from the detector 118 and feed the data to additional components within the metrology system 100 or external to the metrology system 100.

The memory medium 130 may include any storage medium known in the art suitable for storing program instructions executable by the associated one or more processors 128. For example, the memory medium 130 may include a non-transitory memory medium. By way of another example, the memory medium 130 may include, but is not limited to, a read-only memory, a random access memory, a magnetic or optical memory device (e.g., disk), a magnetic tape, a solid state drive and the like. It is further noted that memory medium 130 may be housed in a common controller housing with the one or more processors 128. In one embodiment, the memory medium 130 may be located remotely with respect to the physical location of the one or more processors 128 and controller 126. For instance, the one or more processors 128 of controller 126 may access a remote memory (e.g., server), accessible through a network (e.g., internet, intranet and the like). Therefore, the above description should not be interpreted as a limitation on the present invention but merely an illustration.

Figure 1B:
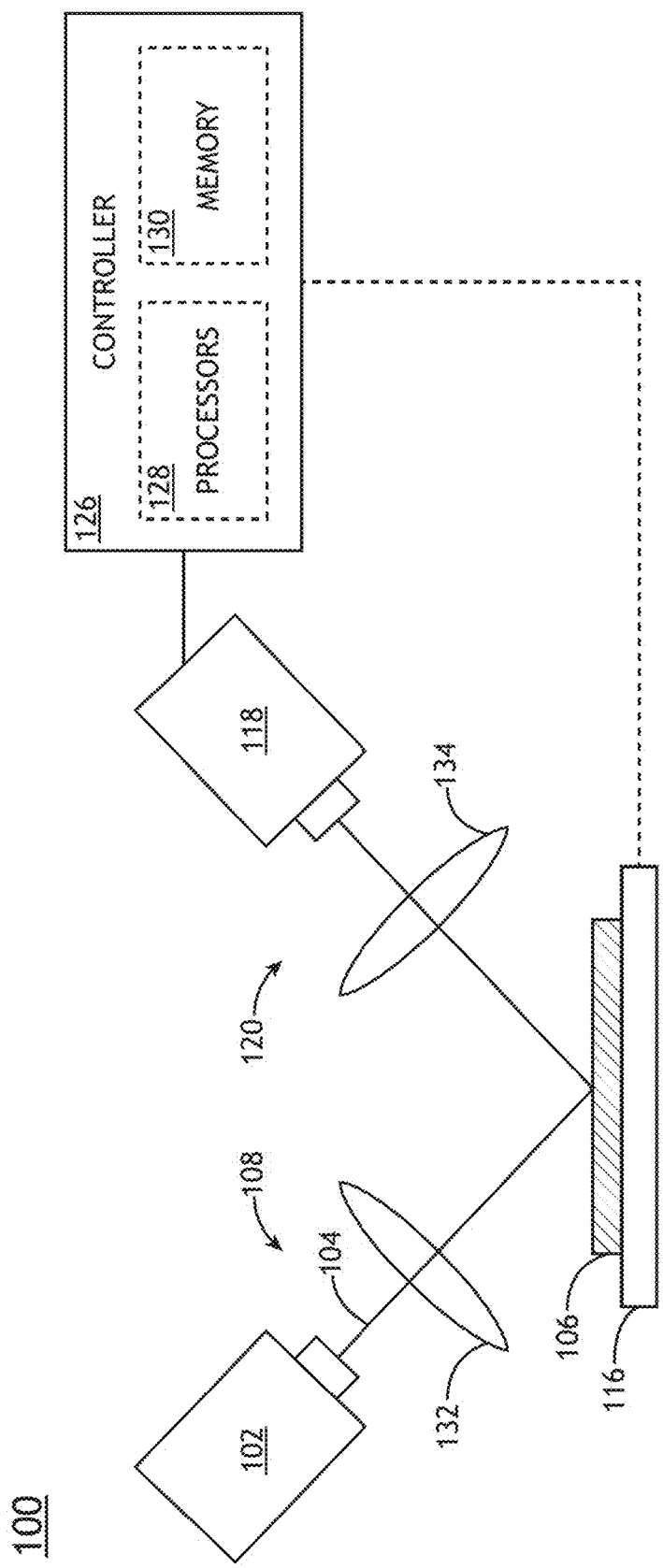
FIG. 1B is a conceptual view illustrating a metrology system in which an illumination pathway and a collection pathway include separate elements, in accordance with one or more embodiments of the present disclosure.

FIG. 1B is a conceptual view illustrating a metrology system 100 in which an illumination pathway 108 and a collection pathway 120 include separate elements, in accordance with one or more embodiments of the present disclosure. For example, the illumination pathway 108 may utilize a first focusing element 132 to focus the metrology illumination beam 104 onto the sample 106 and the collection pathway 120 may utilize a second focusing element 134 to collect radiation from the sample 106. In this regard, the numerical apertures of the first focusing element 132 and the second focusing element 134 may be different. Further, it is noted herein that the metrology system 100 depicted in FIG. 1B may facilitate multi-angle illumination of the sample 106, and/or more than one metrology illumination source 102 (e.g. coupled to one or more additional detectors 118). In this regard, the metrology system 100 depicted in FIG. 1B may perform multiple metrology measurements. In another embodiment, one or more optical components may be mounted to a rotatable arm (not shown) pivoting around the sample 106 such that the angle of incidence of the metrology illumination beam 104 on the sample 106 may be controlled by the position of the rotatable arm.

In another embodiment, the metrology system 100 may include multiple detectors 118 (e.g. associated with multiple beam paths generated by one or more beamsplitters to facilitate multiple metrology measurements (e.g. multiple metrology tools) by the metrology system 100.

In another embodiment, the angle of incidence of the metrology illumination beam 104 on the sample 106 is adjustable. For example, the path of the metrology illumination beam 104 through the beamsplitter 124 and the objective lens 114 may be adjusted to control the angle of incidence of the metrology illumination beam 104 on the sample 106. In this regard, the metrology illumination beam 104 may have a nominal path through the beamsplitter 124 and the objective lens 114 such that the metrology illumination beam 104 has a normal incidence angle on the sample 106. Further, the angle of incidence of the metrology illumination beam 104 on the sample 106 may be controlled by modifying the position and/or angle of the metrology illumination beam 104 on the beamsplitter 124 (e.g., by rotatable mirrors, a spatial light modulator, a free-form illumination source, or the like). In another embodiment, the metrology illumination source 102 directs the one or more metrology illumination beams 104 to the sample 106 at an angle (e.g., a glancing angle, a 45-degree angle, or the like).

In another embodiment, the controller 126 is communicatively coupled to the metrology illumination source 102 and/or elements of the illumination pathway 108 to direct the adjustment of the angle of incidence between the metrology illumination beam 104 and the sample 106. In another embodiment, the controller 126 directs the metrology illumination source 102 to provide one or more selected wavelengths of illumination (e.g. in response to feedback). In a general sense, the controller 126 may be communicatively coupled with any element within the metrology system 100.

Figure 2:
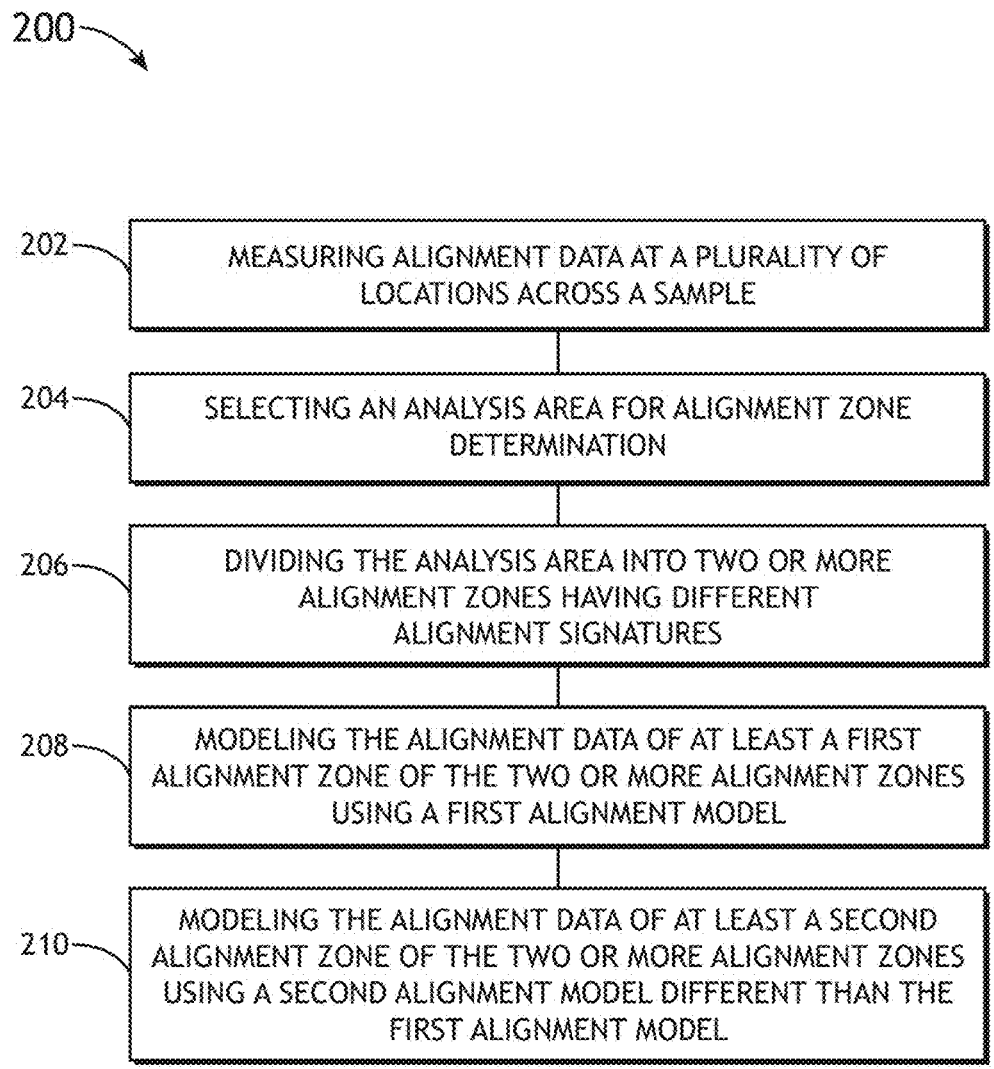
FIG. 2 is a flow diagram illustrating steps performed in a method for automatically determining zones of a wafer having different alignment signatures, in accordance with one or more embodiments of the present disclosure.

FIG. 2 is a flow diagram illustrating steps performed in a method 200 for automatically determining zones of a wafer having different alignment signatures, in accordance with one or more embodiments of the present disclosure. Applicant notes that the embodiments and enabling technologies described previously herein in the context of the metrology system 100 should be interpreted to extend to method 200. It is further noted, however, that the method 200 is not limited to the architecture of the metrology system 100.

In one embodiment, the method 200 includes a step 202 of measuring alignment at a plurality of locations across a sample to generate alignment data. The alignment data may be any type of alignment data known in the art such as, but not limited to, sample alignment data or overlay data. Further, the alignment data may include raw data or residual data. For example, the alignment data may include metrology measurements of alignment targets distributed across the sample to provide an indication of a position and/or orientation of the sample within a production tool. By way of another example, the alignment data may include metrology measurements of overlay targets distributed across the sample to provide the relative positions and/or orientations of two or more printed layers on the sample.

In step 202, alignment may be measured at any distribution of locations across the sample. For example, step 202 may include measuring alignment at a random distribution of locations across the sample. By way of another example, step 202 may include measuring alignment at a periodic or ordered distribution of locations across the sample.

By way of a further example, step 202 may include measuring alignment at locations distributed according to expected variability of alignment data. It may be the case that alignment data based on alignment measurements performed in one region of a sample may be expected to exhibit different statistical characteristics (e.g. mean values, median values, standard deviations, variances, or the like) than alignment data based on alignment measurements performed in additional regions of the sample. For instance, it may be expected that alignment data based on alignment measurements performed near the edge a sample may be expected to exhibit different statistical characteristics than alignment data based on alignment measurements performed in central regions of the sample. Such expectations of the variability of alignment data may be based on any indicator such as, but not limited to, previous measurements of the same or similar samples or performance characteristics of one or more production tools.

In step 202, alignment measurements may be, but are not required to be, carried out using metrology system 100. For example, referring again to FIGS. 1A and 1B, an alignment measurement may be carried out by illuminating at least a portion of a sample 106 with a metrology illumination beam 104 and collecting radiation reflected, diffracted, or scattered from sample 106 with one or more detectors 118. The radiation emanating from the sample 106 may be first collected with an objective lens 114 and directed through a collection pathway 120 to a detector 118. Alignment data associated with the alignment measurements may be generated by a controller 126 and optionally stored in a memory medium 130 based on data generated by the detector 118 indicative of the radiation emanating from the sample 106. Further, the radiation emanating from the sample 106 may be directed to the detector 118 in an imaging or a non-imaging configuration. For instance, in an imaging configuration, the detector 118 may be located in an imaging plane of the metrology system 100 such that an image of at least a portion of the sample 106 may be captured by the detector 118. In another instance, in a non-imaging configuration, the detector 118 may be placed in a pupil plane (e.g. a diffraction plane) such that the angular distribution of radiation from the sample may be captured by the detector 118.

In another embodiment, the method 200 includes a step 204 of selecting (e.g. with the controller 126) an analysis area for alignment zone determination representative of at least a portion of a sample to be analyzed. In this regard, an analysis area may be analyzed to determine whether alignment data within the analysis area exhibits multiple alignment signatures. Further, multiple overlapping or non-overlapping analysis areas associated with portions of the sample may be analyzed.

In step 204, analysis areas may be, but are not required to be, selected for alignment zone determination based on a number of alignment measurements within a particular region. It may be desirable that an analysis area contain a sufficient number of alignment measurements and that statistics of alignment data within the analysis area be statistically significant within a specified tolerance. The specified tolerance may include any measure of statistical significance known in the art.

Figure 3A:
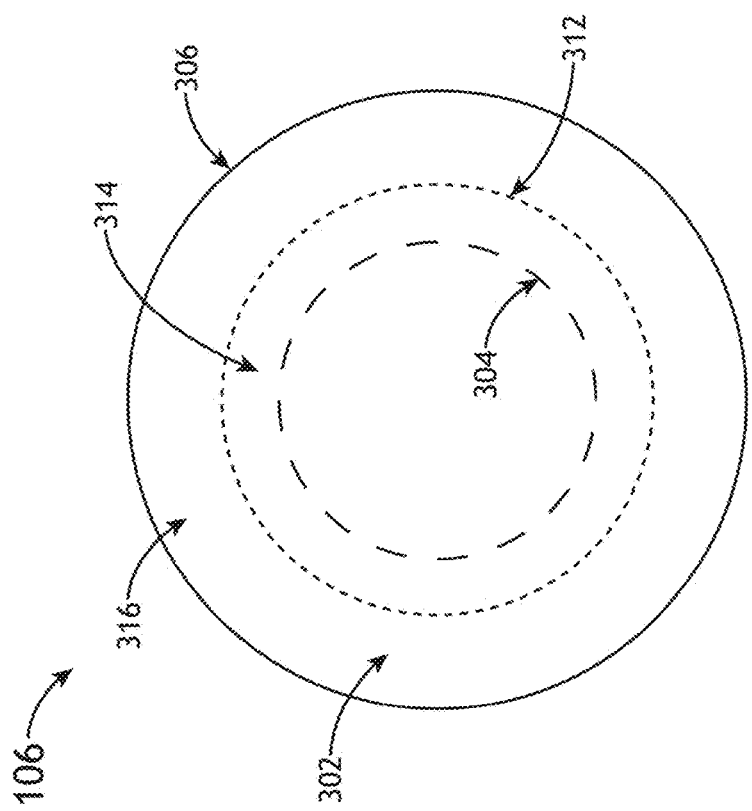
FIG. 3A is a simplified view of a circular sample illustrating an analysis area selected to be an annular region bounded by an inner radius and an outer radius, in accordance with one or more embodiments of the present disclosure.

An analysis area may be selected to have any shape and cover any portion of a sample to be analyzed. FIG. 3A is a simplified view of a circular sample 106 illustrating an analysis area 302 selected to be an annular region bounded by an inner radius 304 and an outer radius 306, in accordance with one or more embodiments of the present disclosure. FIG. 3B is a simplified view of a circular sample 106 illustrating an analysis area 302 selected to be a region of the sample 106 defined by a first radial segment 308 at a first polar angle and a second radial segment 310 at a second polar angle, in accordance with one or more embodiments of the present disclosure. In a general sense, an analysis area 302 may represent any arbitrary region of the sample 106. In one instance, an analysis area 302 may include the entire sample 106.

Figure 4:
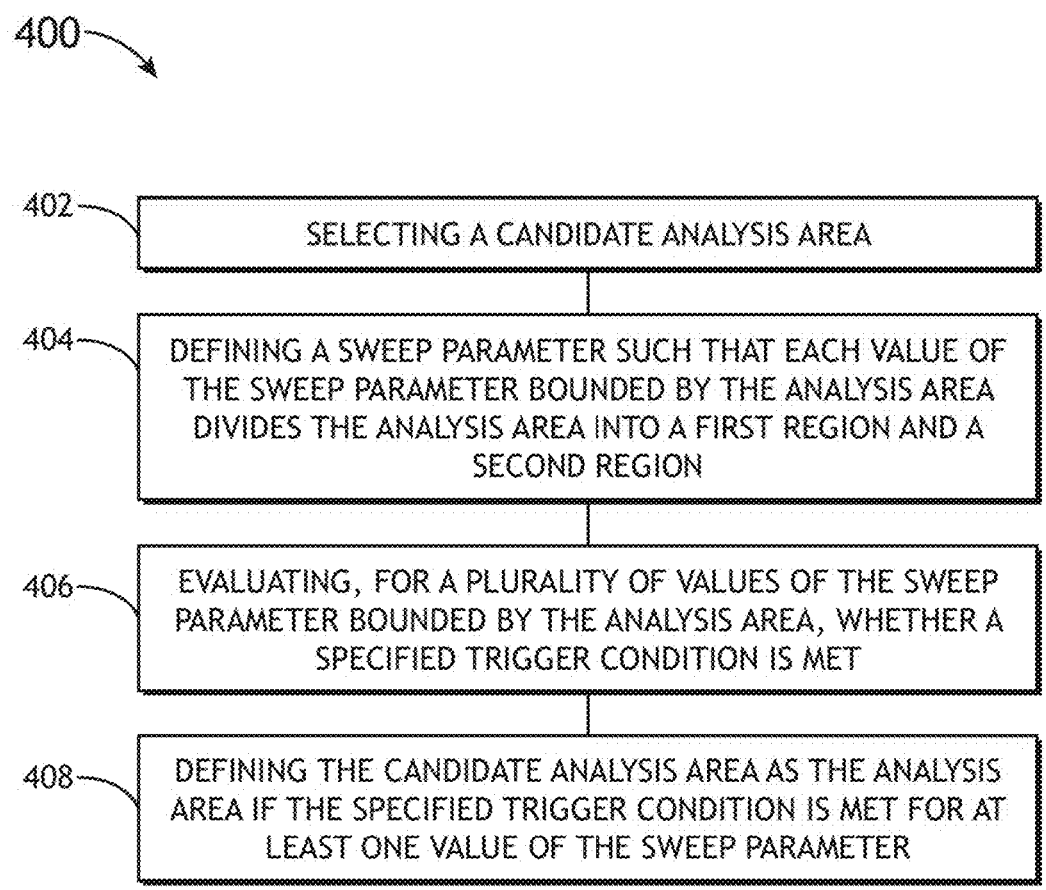
FIG. 4 is a flow diagram illustrating sub-steps associated with selecting an analysis area, in accordance with one or more embodiments of the present disclosure.

In step 204, analysis areas may be, but are not required to be, selected for alignment zone determination based on a specified condition. FIG. 4 is a flow diagram 400 illustrating sub-steps associated with step 204 of selecting an analysis area, in accordance with one or more embodiments of the present disclosure. In one embodiment, step 204 includes a step 402 of selecting a candidate analysis area (e.g., analysis area 302 illustrated in FIG. 3A or 3B) representing at least a portion of the sample.

In another embodiment, step 204 includes a step 404 of defining a sweep parameter such that each value of the sweep parameter bounded by the analysis area divides the analysis area into a first region and a second region. For example, referring to FIG. 3A, the sweep parameter 312 may include a sweep radius bounded by the inner radius 304 and the outer radius 306. In this regard, the sweep parameter 312 divides the analysis area 302 into a first region 314 and a second region 316. By way of another example, referring to FIG. 3B, the sweep parameter 312 may include a polar angle bounded by the first radial segment 308 and the second radial segment 310. In this regard, the sweep parameter 312 divides the analysis area 302 into a first region 314 and a second region 316.

In another embodiment, step 204 includes a step 406 of evaluating, for a plurality of values of the sweep parameter bounded by the analysis area (e.g. sweep parameter 312 illustrated in FIG. 3A or 3B), whether a specified trigger condition is met. In another embodiment, step 204 includes a step 408 of defining the candidate analysis area as the analysis area (e.g. the analysis area for alignment zone determination) if the specified trigger condition is met for at least one value of the sweep parameter 312.

The trigger condition of step 406 and step 408 may include any type of trigger condition known in the art. In one embodiment, a specified trigger condition includes a condition in which an absolute value difference between a mean value of alignment data within the first region 314 and a mean value of alignment data within the second region 316 normalized to a mean value of alignment data within the candidate analysis area (e.g. a normalized sweeping mean) is greater than a specified percentage. The specified percentage may have any value. For example, the specified percentage may be, but is not required to be, any of 5%, 15%, 50% or 90%. By way of another example, the specified percentage may fall within a range of values such as, but not limited to 10% to 20%.

Figure 5:
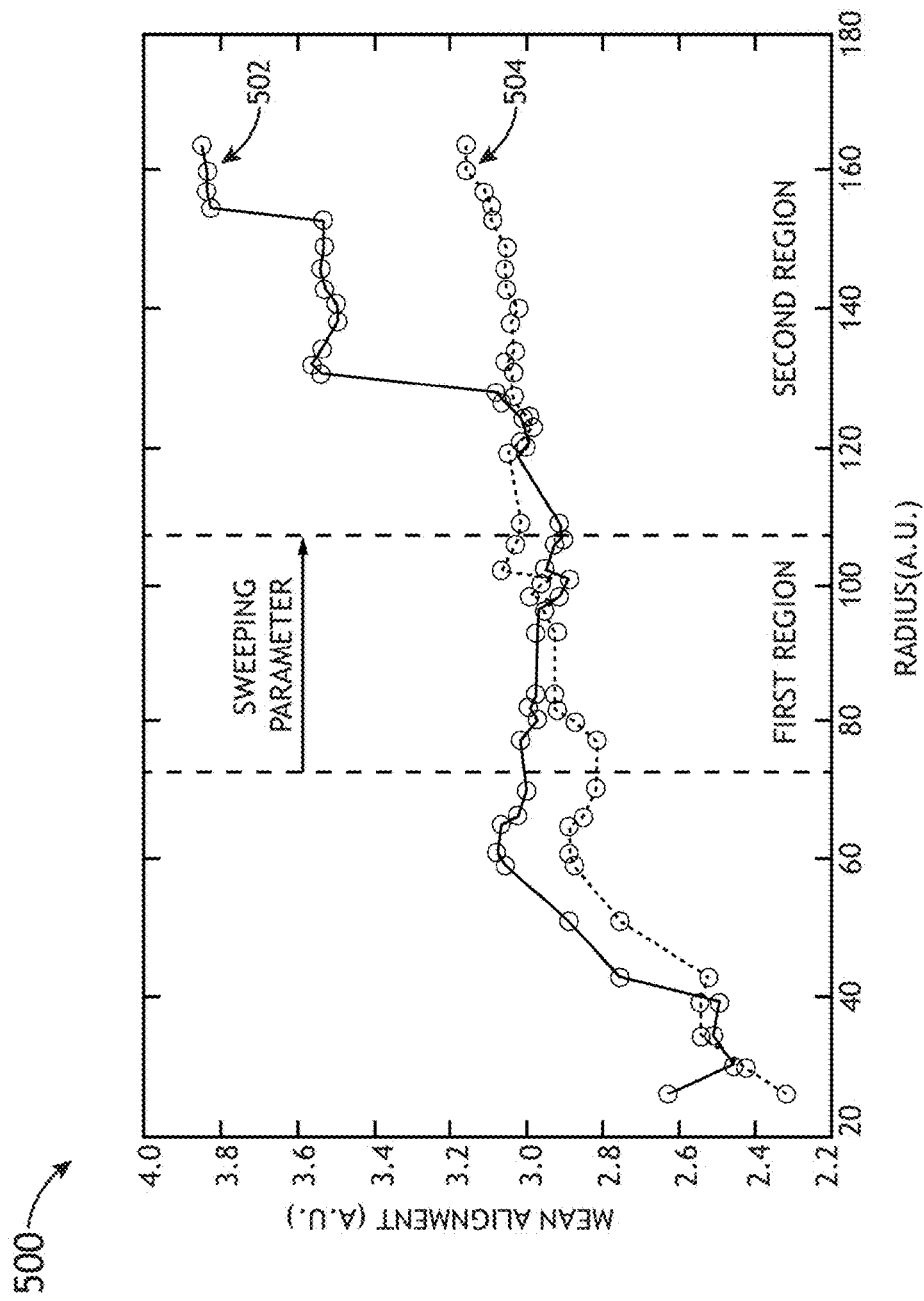
FIG. 5 is a plot illustrating alignment data associated with two samples, in accordance with one or more embodiments of the present disclosure.

FIG. 5 is a plot 500 illustrating alignment data associated with two samples, in accordance with one or more embodiments of the present disclosure. For example, FIG. 5 may provide mean alignment data as a function of radial position for a first sample (see plot 502) and a second sample (see plot 504). In this regard, a data point in FIG. 5 may represent a mean value of alignment data for all measured locations on a sample having a common radial location.

Figure 6:
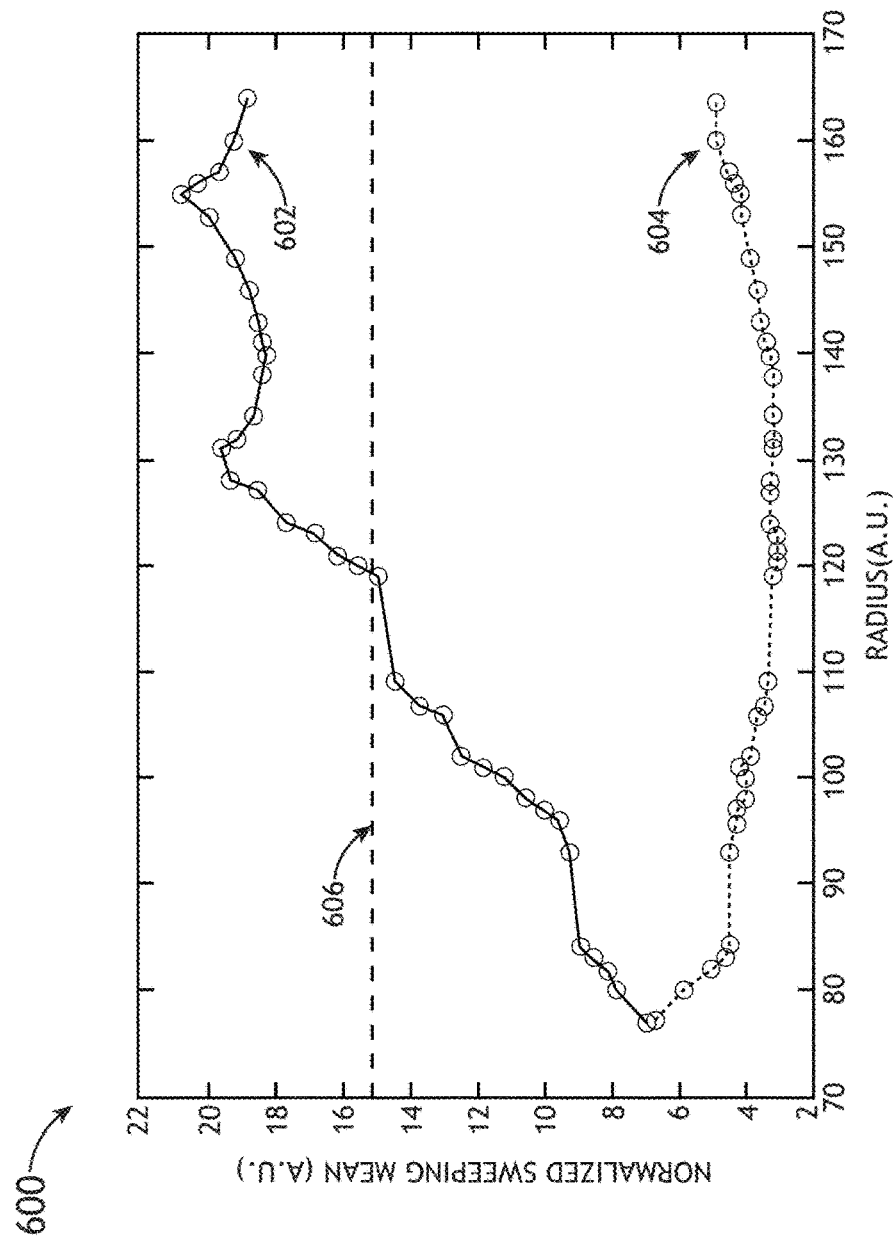
FIG. 6 is a plot illustrating a normalized sweeping mean for the first sample and the second sample of FIG. 5, in accordance with one or more embodiments of the present disclosure.

FIG. 6 is a plot 600 illustrating a normalized sweeping mean for the first sample and the second sample of FIG. 5, in accordance with one or more embodiments of the present disclosure. In this regard, plot 602 of FIG. 6 corresponds to data of plot 502 of FIG. 5. Similarly, plot 604 of FIG. 6 corresponds to data of plot 504 of FIG. 5. In one embodiment, a candidate analysis area of FIGS. 5 and 6 includes portions of a sample having radius values greater than 75 arbitrary units (A.U.). For example, it may be the case that an insufficient number of alignment measurements were taken (e.g., by the metrology system 100) at radius values lower than 75 (A.U.) to provide statistically significant data within a specified tolerance. Further, a sweeping parameter of FIGS. 5 and 6 may include a radial position (e.g., as illustrated in FIG. 3A). In this regard, a data point in FIG. 6 may represent an absolute value difference between a mean value of alignment data within a first region (e.g., first region 314) and a mean value of alignment data within a second region (e.g., second region 316) normalized to a mean value of alignment data within the candidate analysis area (e.g., candidate analysis area 302) as a function of the radius (e.g., the sweep parameter 312).

As illustrated in FIG. 6, a normalized sweeping mean associated with the first sample (e.g., plot 602) rises above a specified threshold value 606 at a radius of 120 A.U. Further, in this particular embodiment, though not required for all embodiments, the normalized sweeping mean is below the threshold value 606 for radius values below 120 A.U. and higher than the threshold value 606 for radius values above 120 A.U. Accordingly, the candidate analysis area associated with the first sample (e.g., associated with plots 502 of FIG. 5 and 602 of FIG. 6) may be selected as an analysis area for alignment zone detection in step 204. In contrast, a normalized sweeping mean associated with the second sample (e.g., plot 604) does not rise above the specified threshold value 606 for any radius in the candidate analysis area. Accordingly, the candidate analysis area associated with the second sample (e.g., associated with plots 504 of FIG. 5 and 604 of FIG. 6) may not be selected as an analysis area for alignment zone detection in step 204.

In another embodiment, a specified trigger condition includes a condition in which an absolute value difference between a median value of alignment data within the first region 314 and a median value of alignment data within the second region 316 is greater than a specified percentage of a mean value of alignment data within the candidate analysis area (e.g. analysis area 302). In a general sense, any condition may be used as a trigger condition to determine whether a candidate analysis area will be defined as an analysis area for alignment zone determination.

In another embodiment, the method 200 includes a step 206 of dividing the analysis area into two or more alignment zones having different alignment signatures. In step 206, the analysis area may be divided into two or more alignment zones having different alignment signatures according to any alignment signal metric. For example, step 206 may include defining a sweep parameter such that each value of the sweep parameter bounded by the analysis area divides the analysis area into a first region and a second region. The sweep parameter of step 206 may include, but is not required to include, the same sweep parameter utilized in step 204 (e.g. a radius, a polar angle of a radial segment, or the like). Additionally, step 206 may include selecting a value of the sweep parameter as a zone boundary to minimize, within a specified tolerance, a difference between an alignment signal metric applied to the first region and the alignment signal metric applied to the second region. In this regard, the zone boundary coupled with the boundaries of the analysis area may define the first alignment zone and the second alignment zone.

For example, an alignment signal metric may include a measure of the value of alignment data (e.g., a mean, a median, or the like). In this regard, continuing the example above illustrated in FIGS. 5 and 6, zone boundaries may be defined at radius values of 75 and 155 A.U. Accordingly, the first sample (e.g., associated with plots 502 and 602) may be divided into a first alignment signature zone defined by radius values between 75 and 130 A.U, a second alignment signature zone defined by radius values between 130 and 155 A.U, and a third alignment signature zone defined by radius values greater than 155 A.U. Alignment data within each alignment signature zone may thus be grouped according to the mean alignment within a specified tolerance (see FIG. 5).

By way of another example, an alignment signal metric may include a measure of variation of alignment data (e.g. standard deviation, variance, or the like). In this regard, the two or more alignment signature zones may be defined such that variations of alignment data associated with alignment measurements within each of the alignment signature zones may be minimized within a specified tolerance.

Figure 7:
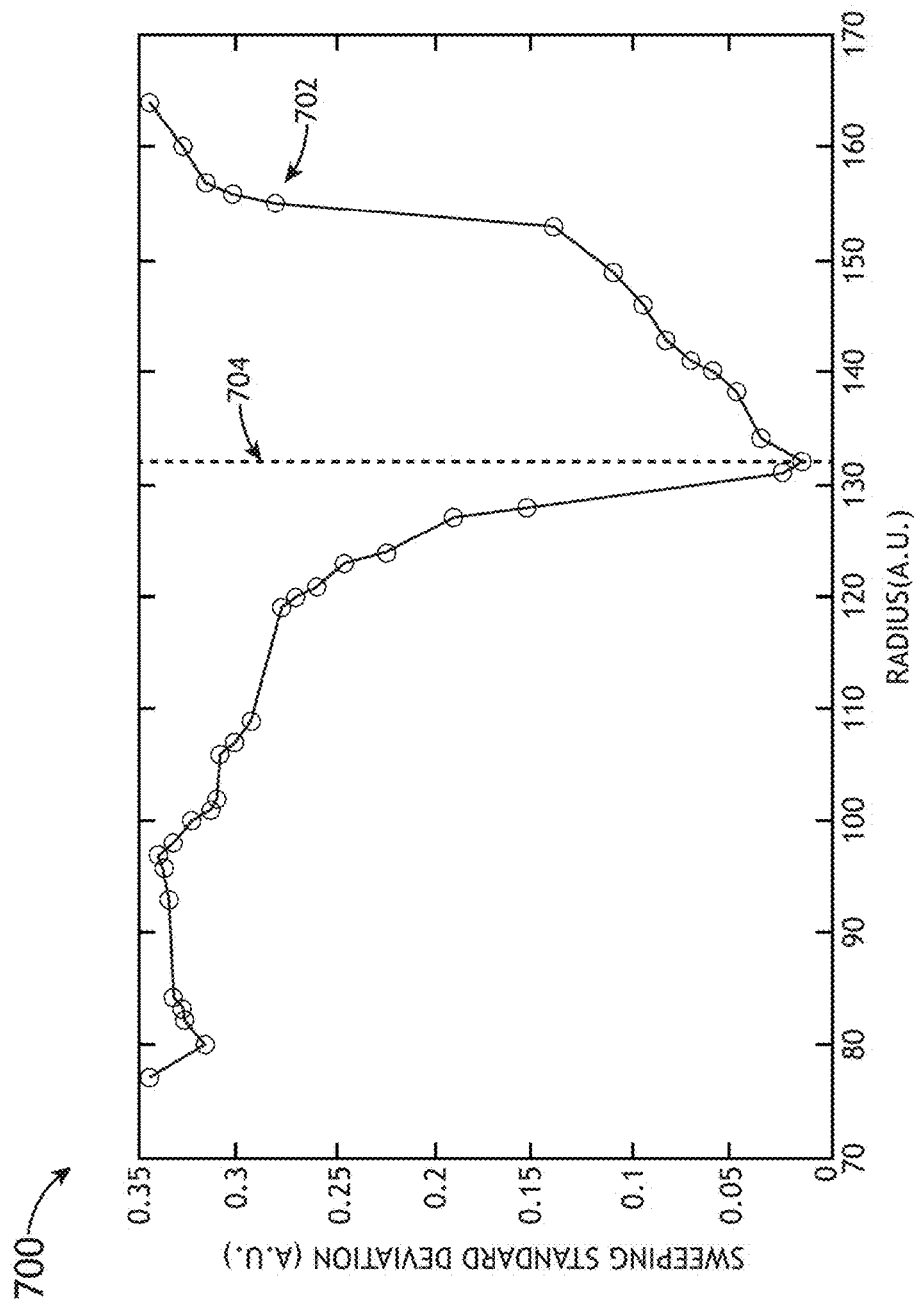
FIG. 7 is a plot illustrating an alignment signal metric including a sweeping standard deviation of the first sample of FIG. 5, in accordance with one or more embodiments of the present disclosure.

FIG. 7 is a plot 700 illustrating an alignment signal metric including a sweeping standard deviation of the first sample of FIG. 5 (e.g., plot 702 is associated with plots 502 and 602), in accordance with one or more embodiments of the present disclosure. For example, a sweeping parameter may include a radius value (e.g., sweep parameter 312 as utilized in step 204). In this regard, each data point of FIG. 7 may represent a difference between a standard deviation of alignment data within the first region (e.g., first region 314) and a standard deviation of alignment data with the second region (e.g., second region 316). In one embodiment, step 206 includes selecting a zone boundary as a value of the radius (e.g., the sweeping parameter) that minimizes the sweeping standard deviation. For example, as indicated in FIG. 7, a radius value of 132 A.U. (e.g., illustrated by line 704) may be selected as a zone boundary that minimizes the sweeping standard deviation.

In another embodiment, any data processing technique known in the art may be utilized to facilitate the analysis of alignment data and/or data representing an alignment signal metric. Data processing techniques may include, but are not limited to, data smoothing, data interpolation, data filtering, discontinuity analyses, or derivative analyses (e.g., second-derivative analysis, or the like). In this regard, data processing techniques may decrease noise artifacts and/or increase the robustness of the method 200. For example, data processing techniques may be applied to alignment data (e.g., as illustrated in FIG. 5) or calculations based on the alignment data (e.g., illustrated in FIG. 6) to facilitate the selection of an analysis area in step 204. By way of another example, data processing techniques may be applied to an alignment signal metric (e.g., illustrated in FIG. 7) to facilitate dividing the analysis area into two or more alignment zones having different alignment signatures in step 206.

In another embodiment, the method 200 includes a step 208 of modeling the alignment data of at least a first alignment zone of the two or more alignment zones using a first alignment model. In another embodiment, the method 200 includes a step 210 of modeling the alignment data of at least a second alignment zone of the two or more alignment zones using a second alignment model different than the first alignment model.

It is recognized herein that a sample may be divided into multiple fields. For example, a sample may be divided into fields based on groupings of fabricated features on the sample (e.g. chips). By way of another example, a sample may be divided into fields corresponding to a field of view of one or more production tools (e.g. lithography tools, metrology tools, or the like). For instance, a lithography stepper tool may sequentially expose a series of fields on a sample in which the size of each field corresponds to a field of view of the lithography stepper tool. Accordingly, alignment (e.g. sample alignment, overlay alignment, or the like) may be measured and potentially corrected for each field of the sample. Further, each field of the sample may have multiple locations at which alignment may be measured.

Any alignment models and decompositions known in the art may be utilized in step 208 or step 210 of method 200. For example, an alignment zone may be modeled by a composite field model which all alignment data from all fields within the alignment zone are aggregated together and a common alignment correction (e.g. a difference between a desired alignment and a measured alignment) may be generated for all fields within the alignment zone. By way of another example, an alignment zone may be modeled by a field-by-field model in which a separate alignment correction may be generated for each field within the alignment zone. By way of another example, an alignment zone may be modeled by a die-by-die model in which a separate alignment correction may be generated for each die in the fields within the alignment zone. By way of a further example, an alignment zone may be modeled by an extrapolated field-by-field model in which a separate alignment correction may be generated for each field within the alignment zone, but alignment corrections for a given field may be based at least in part on alignment data from adjacent or nearby fields. Additionally, alignment models may be based on any coordinate decomposition such as polynomial models (e.g. X-Y decomposition), or radial/tangential models based (e.g. polar decomposition).

In a general sense, modeling the two or more alignment zones determined in step 206 by separate models (e.g. step 208 and step 210) may facilitate a more accurate determination of alignment across the entire sample than modeling the entire sample with a single model. For example, the alignment residual across the sample may be reduced relative to modeling the entire sample with a single model.

In another embodiment, the alignment signal metric includes the minimization of alignment residual values within a specified tolerance based on the direct application of alignment models. For example, step 206 may include defining a sweep parameter such that each value of the sweep parameter bounded by the analysis area divides the analysis area into a first region and a second region. The sweep parameter of step 206 may include, but is not required to include, the same sweep parameter utilized in step 204 (e.g. a radius, a position of a radial segment, or the like). Additionally, step 206 may include applying, for a plurality of values of the sweep parameter bounded by the analysis area, a first alignment model to alignment data within the first region and a second alignment model to alignment data within the second region. Further step 206 may include selecting the value of the sweep parameter as a zone boundary to minimize, within the specified tolerance, residual values associated with the first alignment model and the second alignment model.

Referring again to FIGS. 1A and 1B, embodiments of the present disclosure may incorporate any type of metrology system known in the art including, but not limited to, a spectroscopic ellipsometer with one or more angles of illumination, a spectroscopic ellipsometer for measuring Mueller matrix elements (e.g. using rotating compensators), a single-wavelength ellipsometer, an angle-resolved ellipsometer (e.g. a beam-profile ellipsometer), a spectroscopic reflectometer, a single-wavelength reflectometer, an angle-resolved reflectometer (e.g. a beam-profile reflectometer), an imaging system, a pupil imaging system, a spectral imaging system, or a scatterometer. Further, the metrology system may include a single metrology tool or multiple metrology tools. A metrology system incorporating multiple metrology tools is generally described in U.S. Pat. No. 7,478,019. The use of high-numerical-aperture tools with simultaneous multiple angle-of-incidence illumination is generally described by U.S. Pat. No. 6,429,943, which is incorporated herein by reference in its entirety. Quantifying imaging performance in high NA optical lithography is generally described in Lee, et al., "Quantifying imaging performance bounds of extreme dipole illumination in high NA optical lithography", Proc. of SPIE Vol. 9985 99850X-1 (2016), which is incorporated herein by reference in its entirety.

It is further recognized herein that a metrology tool may measure characteristics of one or more targets on the sample such as, but not limited to, alignment position or overlay. The targets may include certain regions of interest that are periodic in nature, such as for example gratings in a memory die. The metrology targets may further possess various spatial characteristics and are typically constructed of one or more cells which may include features in one or more layers which may have been printed in one or more lithographically distinct exposures. The targets or the cells may possess various symmetries such as two-fold or four-fold rotation symmetry and/or reflection symmetry. Examples of such metrology structures are described in U.S. Pat. No. 6,985,618, which is included herein by reference in its entirety. Different cells or combinations of cells may belong to distinct layers or exposure steps. The individual cells may comprise either isolated non-periodic features or alternately they may be constructed from one-, two- or three-dimensional periodic structures or combinations of non-periodic and periodic structures. The periodic structures may be non-segmented or they may be constructed from finely segmented features which may be at or close to the minimum design rule of the lithographic process used to print them. The use of a metrology tool to characterize non-periodic targets is generally described in U.S. Pat. No. 9,291,554, granted on Mar. 22, 2016, which is incorporated herein by reference in its entirety.

Metrology targets may be collocated or in close proximity with dummification structures in the same layer or in a layer above, below or in between the layers of the metrology structures. Targets can include multiple layers (e.g. films) whose thicknesses can be measured by the metrology tool.

Targets can include target designs placed on the semiconductor wafer for use (e.g., with alignment, overlay registration operations, and the like). Further, targets may be located at multiple sites on the semiconductor wafer. For example, targets may be located within scribe lines (e.g., between dies) and/or located in the die itself. Multiple targets may be measured simultaneously or serially by the same or multiple metrology tools as described in U.S. Pat. No. 7,478,019, which is incorporated herein by reference in its entirety.

Additionally, measurement of parameters of interest may involve a number of algorithms. For example, optical interaction of the metrology illumination beam 104 with a metrology target on the sample 106 may, but is not limited to, be modeled using an electro-magnetic (EM) solver. Further, the EM solver may utilize any method known in the art including, but not limited to, rigorous coupled-wave analysis (RCWA), finite element method analysis, method of moments analysis, a surface integral technique, a volume integral technique, or a finite-difference time-domain analysis. Additionally, collected data may be analyzed using data fitting and optimization techniques including, but not limited to, libraries, fast-reduced-order models, regression, machine-learning algorithms such as neural networks, support-vector machines (SVM), dimensionality-reduction algorithms (e.g., principal component analysis (PCA), independent component analysis (ICA), local-linear embedding (LLE), and the like), sparse representation of data (e.g., Fourier or wavelet transforms, Kalman filters, algorithms to promote matching from same or different tool types, and the like). For example, data collection and/or fitting may be, but is not required to be, performed by the Signal Response Metrology (SRM) software product provided by KLA-TENCOR.

In another embodiment, raw data generated by a metrology tool is analyzed by algorithms that do not include modeling, optimization and/or fitting (e.g. phase characterization, or the like). The use of symmetric target design in scatterometry overlay metrology is generally described in U.S. Patent Publication No. 2015/0204664, published on Jul. 23, 2015, which is incorporated herein by reference in its entirety. It is noted herein that computational algorithms performed by the controller may be, but are not required to be, tailored for metrology applications through the use of parallelization, distributed computation, load-balancing, multi-service support, design and implementation of computational hardware, or dynamic load optimization. Further, various implementations of algorithms may be, but are not required to be, performed by the controller (e.g. though firmware, software, or field-programmable gate arrays (FPGAs), and the like), or one or more programmable optical elements associated with the metrology tool. The use of process modeling is generally described in U.S. Patent Publication No. 2014/0172394, published on Jun. 19, 2014, which is incorporated herein by reference in its entirety.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A semiconductor tool comprising:
    an illumination source configured to generate an illumination beam;
    one or more illumination optical elements configured to direct a portion of the illumination beam to a sample;
    a detector;
    one or more collection optical elements configured to direct radiation emanating from the sample to the detector; and
    a controller communicatively coupled to the detector, the controller including one or more processors configured to execute program instructions configured to cause the one or more processors to:
        measure alignment at a plurality of locations across the sample to generate alignment data based on the collection of radiation emanating from the sample by the detector in response to illumination from the illumination beam;
        select an analysis area for alignment zone determination including at least some of the plurality of locations across the sample;
        determine one or more zone boundaries dividing the analysis area into two or more alignment zones having different alignment signatures by minimizing, within a selected tolerance providing a selected trigger condition, interzone variations of portions of the alignment data associated with difference locations within the two or more alignment zones;
        model the portions of the alignment data associated with the two or more alignment zones using two or more alignment models when the specified trigger condition is met; and
        provide overlay data to correct for overlay errors in at least one of the sample or one or more additional samples, wherein the overlay data is based on the two or more alignment models applied to the two or more alignment zones when the specified trigger condition is met.

2. The semiconductor tool of claim 1, wherein selecting the analysis area for alignment zone determination comprises:
    selecting a candidate analysis area, the candidate analysis area including at least some of the plurality of locations across the sample;
    defining a sweep parameter such that each value of the sweep parameter bounded by the analysis area divides the analysis area into a first region and a second region;
    evaluating, for a plurality of values of the sweep parameter bounded by the analysis area, whether the specified trigger condition is met; and
    defining the candidate analysis area as the analysis area if the specified trigger condition is met for at least one value of the sweep parameter.

3. The semiconductor tool of claim 2, wherein the specified trigger condition comprises:
    an absolute value difference between a mean value of a portion of the alignment data associated with the first region and a mean value of a portion of the alignment data associated with the second region is greater than a specified percentage of a mean value of a portion of the alignment data associated with the candidate analysis area.

4. The semiconductor tool of claim 3, wherein the specified percentage is within a range of 10% to 20%.

5. The semiconductor tool of claim 3, wherein the specified percentage is approximately 15%.

6. The semiconductor tool of claim 1, wherein selecting the analysis area for alignment zone determination comprises:

including regions of the sample having statistically significant alignment data.

7. The semiconductor tool of claim 1, wherein determining the one or more zone boundaries dividing the analysis area into the two or more alignment zones comprises:
defining a sweep parameter such that each value of the sweep parameter bounded by the analysis area divides the analysis area into a first region and a second region; and
selecting a value of the sweep parameter as a zone boundary to minimize, within a specified tolerance, a difference between an alignment signal metric applied to the first region and the alignment signal metric applied to the second region, wherein the zone boundary divides the analysis area into the first alignment zone and the second alignment zone.

8. The semiconductor tool of claim 7, wherein selecting the value of the sweep parameter as the zone boundary comprises:
selecting the value of the sweep parameter as the zone boundary to minimize, within the specified tolerance, a difference between a standard deviation of the portion of the alignment data associated with the first region and a standard deviation of the portion of the alignment data associated with the second region.

9. The semiconductor tool of claim 1, wherein determining the one or more zone boundaries dividing the analysis area into the two or more alignment zones comprises:
defining a sweep parameter such that each value of the sweep parameter bounded by the analysis area divides the analysis area into a first region and a second region;
applying, for a plurality of values of the sweep parameter bounded by the analysis area, a first alignment model to a portion of the alignment data associated with the first region and a second alignment model to a portion of the alignment data associated with the second region; and
selecting the value of the sweep parameter as a zone boundary to minimize, within the specified tolerance, residual values associated with the first alignment model and the second alignment model.

10. The semiconductor tool of claim 1, wherein the alignment data comprises:
at least one of alignment data associated with an alignment measurement of a lithography system prior the fabrication of a semiconductor layer, or overlay data associated with an alignment of two or more fabricated semiconductor layers.

11. The semiconductor tool of claim 1, wherein the alignment data comprises:
at least one of raw data or residual data.

12. The semiconductor tool of claim 1, wherein the sweep parameter comprises:
a radial location on the sample.

13. The semiconductor tool of claim 1, wherein the sweep parameter comprises:
a polar angle on the sample.

14. The semiconductor tool of claim 1, wherein the one or more processors are further configured to execute program instructions configured to cause the one or more processors to apply a data processing operation to the alignment data.

15. The semiconductor tool of claim 14, wherein the data processing operation comprises:
at least one of a data smoothing operation, a data interpolation operation, a data filtering operation, a discontinuity analysis, or a derivative analysis.

16. The semiconductor of claim 1, wherein determining the one or more zone boundaries dividing the analysis area in to the two or more alignment zones comprises:
defining a sweep parameter such that each value of the sweep parameter bounded by the analysis area divides the analysis area into a first region and a second region;
evaluating, for a plurality of values of the sweep parameter bounded by the analysis area, whether the specified trigger condition is met; and
determining a zone boundary of the one or more zone boundaries as the sweep parameter if the specified trigger condition is met for at least one value of the sweep parameter.

17. The semiconductor tool of claim 16, wherein the specified trigger condition comprises:
an absolute value difference between a mean value of a portion of the alignment data associated with the first region and a mean value or a portion of the alignment data associated with the second region is greater than a specified percentage of a mean value of a portion of the alignment data associated with the candidate analysis area.

18. The semiconductor tool of claim 17, wherein the specified percentage is within a range of 10% to 20%.

19. A semiconductor tool comprising:
an illumination source configured to generate an illumination beam;
one or more illumination optical elements configured to direct a portion of the illumination beam to a sample;
a detector;
one or more collection optical elements configured to direct radiation emanating from the sample to the detector; and
a controller communicatively coupled to the detector, the controller including one or more processors configured to execute program instructions configured to cause the one or more processors to:
measure alignment at a plurality of locations across the sample to generate alignment data based on the collection of radiation emanating from the sample by the detector in response to illumination from the illumination beam;
select an analysis area for alignment zone determination, the analysis area representative of at least a portion of the sample;
define a sweep parameter such that each value of the sweep parameter bounded by the analysis area divides the analysis area into a first region and a second region;
select a value of the sweep parameter as a zone boundary to minimize, within a specified tolerance, a difference between an alignment signal metric applied to portions of the alignment data associated with the first region and the alignment signal metric applied to portions of alignment data associated with the second region, wherein the zone boundary divides the analysis area into a first alignment zone and a second alignment zone;
model the alignment data of the first alignment zone using a first alignment model;
model the alignment data of the second alignment zone using at least a second alignment model different than the first alignment model; and
provide overlay data to correct for overlay errors in at least one of the sample or one or more additional samples, wherein the overlay data is based on the first alignment model for locations in the first alignment zone and based on the at least a second alignment model for locations in the at least a second alignment zone.

20. The semiconductor tool of claim 19, wherein selecting the analysis area for alignment zone determination comprises:
    selecting a candidate analysis area, the candidate analysis area including at least some of the plurality of locations across the sample;
    defining a sweep parameter such that each value of the sweep parameter bounded by the analysis area divides the analysis area into a first region and a second region;
    evaluating, for a plurality of values of the sweep parameter bounded by the analysis area, whether a specified trigger condition is met; and
    defining the candidate analysis area as the analysis area if the specified trigger condition is met for at least one value of the sweep parameter.

21. The semiconductor tool of claim 16, wherein selecting the analysis area for alignment zone determination comprises:
    including regions of the sample having statistically significant alignment data.

22. The semiconductor tool of claim 19, wherein selecting the value of the sweep parameter as the zone boundary comprises:
    selecting the value of the sweep parameter as the zone boundary to minimize, within the specified tolerance, a difference between a standard deviation of the portion of the alignment data associated with the first region and a standard deviation of the portion of the alignment data associated with the second region.

23. The semiconductor tool of claim 16, wherein the alignment data comprises:
    at least one of alignment data associated with an alignment measurement of a lithography system prior the fabrication of a semiconductor layer, or an overlay data associated with an alignment of two or more fabricated semiconductor layers.

24. The semiconductor tool of claim 16, wherein the alignment data comprises:
    at least one of raw data or residual data.

25. The semiconductor tool of claim 16, wherein the sweep parameter comprises:
    a radial location on the sample.

26. The semiconductor tool of claim 16, wherein the sweep parameter comprises:
    a polar angle on the sample.

27. The semiconductor tool of claim 16, wherein the one or more processors are further configured to execute program instructions configured to cause the one or more processors to apply a data processing operation to the alignment data.

28. The semiconductor tool of claim 27, wherein the data processing operation comprises:
    at least one of a data smoothing operation, a data interpolation operation, a data filtering operation, a discontinuity analysis, or a derivative analysis.

29. A method comprising:
    measuring, with a semiconductor tool, alignment at a plurality of locations across a sample to generate alignment data based on radiation emanating from the sample collected by a detector of the semiconductor tool in response to illumination from an illumination beam;
    selecting an analysis area for alignment zone determination, the analysis area representative of at least a portion of the sample;
    determining one or more zone boundaries dividing the analysis area into two or more alignment zones having different alignment signatures by minimizing, within a selected tolerance providing a selected trigger condition, interzone variations of portions of the alignment data associated with difference locations within the two or more alignment zones;
    modeling the alignment data of at least a first alignment zone of the two or more alignment zones using a first alignment model when the specified trigger condition is met;
    modeling the alignment data of at least a second alignment zone of the two or more alignment zones using at least a second alignment model different than the first alignment model when the specified trigger condition is met; and
    providing overlay data to correct for overlay errors in at least one of the sample or one or more additional samples, wherein the overlay data is based on the first alignment model for locations in the first alignment zone and based on the at least a second alignment model for locations in the at least a second alignment zone when the specified trigger condition is met.

30. The method of claim 29, wherein selecting the analysis area for alignment zone determination comprises:
    selecting a candidate analysis area, the candidate analysis area including at least some of the plurality of locations across the sample;
    defining a sweep parameter such that each value of the sweep parameter bounded by the analysis area divides the analysis area into a first region and a second region;
    evaluating, for a plurality of values of the sweep parameter bounded by the analysis area, whether a specified trigger condition is met; and
    defining the candidate analysis area as the analysis area if the specified trigger condition is met for at least one value of the sweep parameter.

31. The method of claim 29, wherein selecting the analysis area for alignment zone determination comprises:
    including regions of the sample having statistically significant alignment data.

32. The method of claim 29, wherein determining the one or more zone boundaries dividing the analysis area into the two or more alignment zones comprises:
    defining a sweep parameter such that each value of the sweep parameter bounded by the analysis area divides the analysis area into a first region and a second region; and
    selecting a value of the sweep parameter as a zone boundary to minimize, within a specified tolerance, a difference between an alignment signal metric applied to the first region and the alignment signal metric applied to the second region, wherein the zone boundary divides the analysis area into the first alignment zone and the second alignment zone.

33. The method of claim 32, wherein selecting the value of the sweep parameter as the zone boundary comprises:
    selecting the value of the sweep parameter as the zone boundary to minimize, within the specified tolerance, a difference between a standard deviation of the portion of the alignment data associated with the first region and a standard deviation of the portion of the alignment data associated with the second region.

34. The method of claim 29, wherein determining the one or more zone boundaries dividing the analysis area into the two or more alignment zones comprises:

defining a sweep parameter such that each value of the sweep parameter bounded by the analysis area divides the analysis area into a first region and a second region;

applying, for a plurality of values of the sweep parameter bounded by the analysis area, a first alignment model to a portion of the alignment data associated with the first region and a second alignment model to a portion of the alignment data associated with the second region; and selecting the value of the sweep parameter as a zone boundary to minimize, within the specified tolerance, residual values associated with the first alignment model and the second alignment model.

\* \* \* \* \*